United States Patent [19]

Yassaie et al.

[11] Patent Number: 4,920,508
[45] Date of Patent: Apr. 24, 1990

[54] MULTISTAGE DIGITAL SIGNAL MULTIPLICATION AND ADDITION

[75] Inventors: Mohamad H. Yassaie, Bristol; Anthony D. King-Smith, Dursley; Clive M. Dyson, Bristol, all of England

[73] Assignee: Inmos Limited, Bristol, England

[21] Appl. No.: 52,249

[22] Filed: May 19, 1987

[30] Foreign Application Priority Data

May 22, 1986 [GB] United Kingdom ............... 8612453

[51] Int. Cl.$^5$ .............................................. G06F 7/38
[52] U.S. Cl. ................................................... 364/736
[58] Field of Search ............. 364/724, 736, 754, 757, 364/758, 759, 760, 768, 784

[56] References Cited

U.S. PATENT DOCUMENTS

| 4,694,416 | 9/1987 | Wheeler et al. | 364/736 |
| 4,701,876 | 10/1987 | McCanny et al. | 364/754 |
| 4,817,028 | 3/1989 | Masson et al. | 364/736 |

FOREIGN PATENT DOCUMENTS

0201281 11/1986 European Pat. Off. .
1099340 7/1968 United Kingdom .

Primary Examiner—Gary V. Harkcom
Assistant Examiner—Long T. Nguyen
Attorney, Agent, or Firm—Edward D. Manzo

[57] ABSTRACT

Multistage digital signal multiplying and adding apparatus suitable for a multistage filter includes a plurality of addition stages each having adding devices for forming a succession of partial products together with selectors operable in a first condition to connect sum and carry outputs of the adding devices within a stage to further adding devices within the stage or a second condition to supply outputs to a further stage, the selectors being operable to change condition without resolving carry signals in one stage through all bit positions of that stage. The output of one stage is connected to a subsequent stage during a first cycle of product formation of the subsequent stage so that the output is accumulated with the first partial product of the subsequent stage.

17 Claims, 6 Drawing Sheets

MULTISTAGE DIGITAL SIGNAL MULTIPLICATION AND ADDITION

FIELD OF THE INVENTION

The invention relates to apparatus for and a method of multistage digital signal multiplication and addition.

The invention is particularly applicable to the processing of digital signals involving repeated addition to achieve multiplication and addition together of a plurality of results of multiplication. Such signal processing is particularly applicable to multistage filters such as transversal filters for use in digital signal processing.

BACKGROUND OF THE INVENTION

Transversal filters are known which incorporate multistage devices, each stage being arranged to calculate the product of two digital signals together with means for adding together products formed by different stages. Such devices are known which achieve multiplication by repeated addition of partial products. However difficulties arise in achieving satisfactory speed of operation particularly where the signals to be multiplied involve a large number of bits. Addition of a plurality of partial products to achieve multiplication involves resolution of carry signals which are generated at one bit position for carrying to a bit position of higher significance. For multibit numbers it is necessary to use very high speed adders if undesirable delays are to be avoided in resolving any carry signals through all bit positions of a product forming operation. Further delays may also be introduced by the operation of adding together the results of a plurality of multiplying operations if the addition is delayed until the product of each separate multiplication has been formed.

It is an object of the present invention to improve the speed of digital signal processing in which repeated addition is carried out to achieve multiplication together with addition of a plurality of results of multiplication.

SUMMARY OF THE INVENTION

The present invention provides multistage digital signal multiplying and adding apparatus for effecting repeated addition to achieve multiplication and addition together of a plurality of results of said multiplication, said apparatus comprising a plurality of addition stages, each stage having a plurality of adding devices at successive bit positions each corresponding to a bit of different significance in a product to be formed by multiplication of a first digital signal for that stage with a second digital signal for that stage, the adding devices of each stage having means for forming partial products by successive operations using the said first digital signal and a selected bit or bits of the said second digital signal, and means for adding successive partial products derived from use of bits of the said second digital signal thereby forming the said product after accumulation of a last partial product, each adding device having output means for providing after each partial product accumulation a first output indicating a sum for that bit position and a second output indicating any carry signal to be carried from that bit position to a bit position of greater significance, and selector means selectively operable between a first condition to supply signals from said first and second outputs of adding devices within a stage to respective adding devices within said stage for use in accumulation with further partial products or in a second condition to supply signals from the first and second outputs of adding devices within a stage after accumulation of the said last partial product to further adding means for forming an addition of the products of more than one stage, said selector means being operable for any one addition stage to change to said second condition without resolving carry signals in said one addition stage through all bit positions within said one addition stage.

The invention also provides multistage digital signal multiplying and adding apparatus for effecting repeated addition to achieve multiplication and addition together of a plurality of results of said multiplication, said apparatus comprising a plurality of addition stages, each stage having a plurality of adding devices at successive bit positions each corresponding to a bit of different significance in a product to be formed by multiplication of a first digital signal for that stage and a second digital signal for that stage, the adding devices of each stage having means for forming partial products by successive operations using the said first digital signal and a selected bit or bits of the said second digital signal, and means for adding successive partial products derived from use of bits of the said second digital signal to an accumulation of any preceding partial products, thereby to generate the said product after accumulation of a last partial product, control means for controlling the operation of each adding device whereby each product is formed by a succession of cycles each involving the accumulation of a partial product, and selector means operable to connect an output from the adding devices of one stage as an input to the adding devices of another stage after formation of a product by said one stage thereby to accumulate the products of more than one stage, said control means being arranged to control said selector means so that said output from one stage is connected to said another stage during a first cycle of product formation by said another stage whereby the output of said one stage may be accumulated in said another stage with the first partial product of said another stage.

The invention also provides a method of processing digital signals by forming a plurality of products of digital signals and adding a plurality of said products together, said method comprising supplying multibit input digital signals to a plurality of multibit addition stages of a multistage adder, supplying a second multibit digital signal to each stage for use in forming a product with the said input digital signal for that stage, forming a product in each stage by a succession of operations each generating a multibit partial product and accumulating the partial product with the sum of any preceding partial products for that stage, the accumulation of the partial products within a stage comprising adding bits of significance and forming carry signals for carrying bits to positions of higher significance when necessary, and after accumulation of the partial products for one stage supplying an output from said one stage for use in addition to a product of another stage, said output from one stage being supplied before complete resolution of any carry signals within said one stage through all bit positions of said one stage.

The invention also provides a method of processing digital signals by forming a plurality of products of digital signals and adding a plurality of said products together, said method comprising supplying multibit input digital signals to a plurality of multibit addition stages of a multistage adder, supplying a second multibit digital signal to each stage for use in forming a product with the said input digital signal for that stage, forming a product in each stage by a succession of operation cycles, each cycle generating a multibit partial product and accumulating the partial product with the sum of any preceding partial products for that stage, and after accumulation of the partial products for one stage supplying an output from said one stage for use in addition to a product of another stage, said output from one stage being supplied to an input of said another stage during a first operation cycle of said another stage whereby the output may be accumulated in said another stage with the first partial product of said another stage.

Preferred embodiments of the invention permit higher speeds of operation to be achieved. They also permit the formation of single chip devices needing less chip area as the adders used in each stage may be lower speed adders each needing less silicon area but which achieve high speed operation overall due to use of the invention.

DESCRIPTION OF THE PREFERRED EMBODIMENTS

Figure 1:
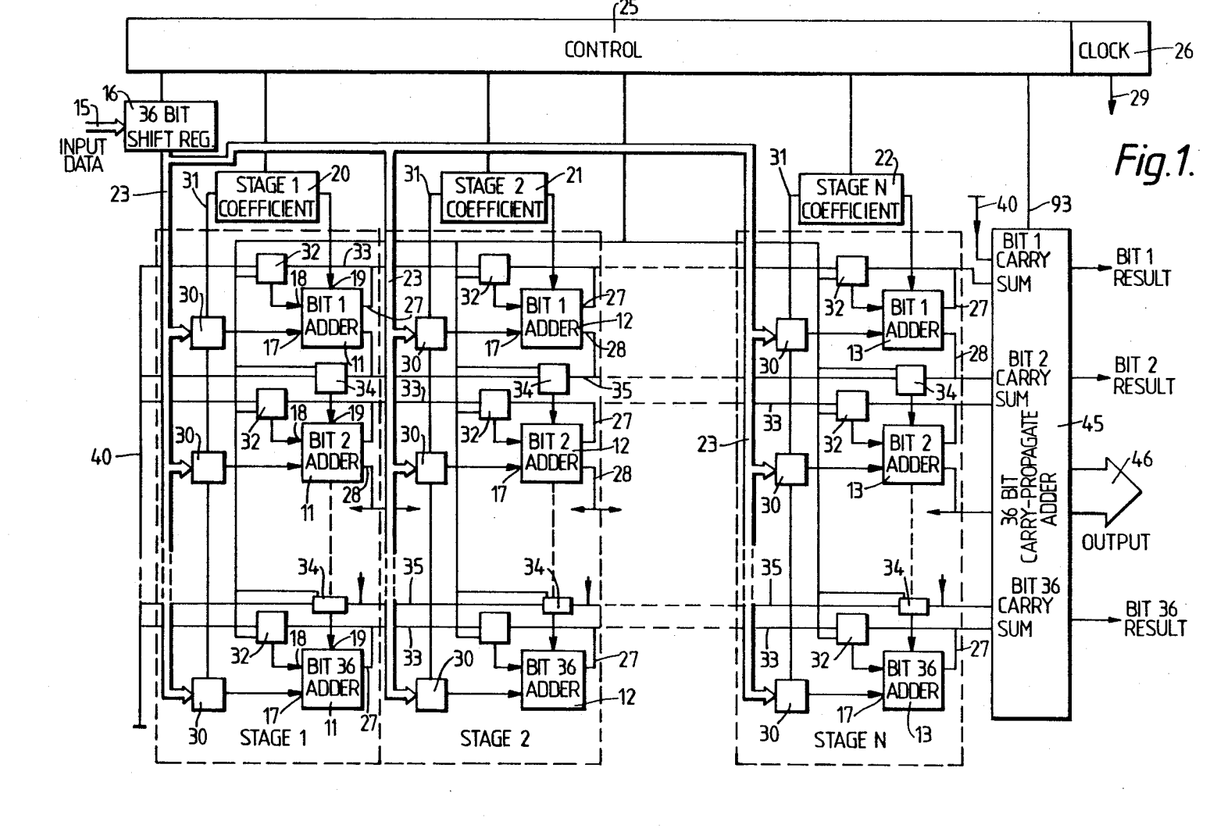
FIG. 1 is a block diagram of a digital transversal filter in accordance with the present invention.

FIG. 1 illustrates digital signal processing apparatus formed on a single integrated circuit chip. This particular example is a CMOS chip in the form of a transversal filter having N stages. Each stage of the filter is arranged to multiply two digital signals by repeated addition of partial products of the two signals and the output indicating the product of one stage is added to that of a subsequent stage. In this particular example the same input data is fed simultaneously as a first digital signal to each of the stages. This input data is to be multiplied by a second digital signal in the form of a weight coefficient selected for each stage. Each stage is connected so that its output forms an input to the next stage thereby forming a chain of interconnected stages. When input data is supplied to each stage, the stage takes a time interval T to calculate the product for that stage and after the lapse of time T the output of that stage is fed to the next stage and a new product calculation is commenced using new updated input data. In this way new products are calculated at each time interval T and the product of each stage is passed one further stage down the chain for each time T elapsed. The output of the filter chain at time $t = kT$ is given by:

$$y[kT] = w(1)*x[kT] + w(2)*x[(k-1)T] + \ldots \ldots + w(N)*x[(k-N+1)T]$$

where $x[kT]$ represents the kth input data sample and $w(1)$ to $w(N)$ are the weight coefficients for the N stages.

In the multistage digital signal adding apparatus illustrated in FIG. 1 the first two stages and the final stage N have been illustrated. In this particular example there may conveniently be 32 stages. Each stage has a plurality of single bit adders at successive bit positions each corresponding to a bit of different significance in the product to be formed by that stage. In this example, the adders of stage 1 have been marked 11, the adders of stage 2 are marked 12 and the adders of stage N are marked 13. In this particular example the input data which forms the first digital signal for each stage is a binary signal and has a wordlength of 16 bits. The weight coefficient forming the second digital signal for use in the multiplication by each stage is a binary signal and has a wordlength that can be programmed to be 4, 8, 12 or 16 bits. The input data is supplied with 16 bits in parallel on a data path 15 to a shift register 16. The shift register 16 is a 36 bit register to allow for shifting of the input data to positions of different significance within the register as a succession of partial products are formed in dependence on the bit pattern in the coefficient to be used for that stage. The coefficients are stored in registers of respective coefficient control units 20, 21 and 22 for each of the stages 1, 2 and N. It will be appreciated that in FIG. 1 the broken lines between stages 2 and stage N indicate the omission for simplicity of a succession of stages similar to stage 2 each interconnected in a chain. Similarly, for simplicity the adders in each stage have been illustrated for bit 1, bit 2 and bit 36 and the broken line within each stage indicates a succession of adders covering bits 3 to 35. These are connected similarly to the adders for bit 2 which have been illustrated.

In this particular example the input data held in the shift register 16 is fed along a 36 bit parallel connection 23 to thirty six separate single bit inputs to each stage of the adding apparatus so that each stage receives the same input data simultaneously. Each stage calculates a product of the input data with the coefficient for that stage under the control of a control unit 25 and a timing clock 26. The timing clock produces a clock signal of the form shown in signal 29 in FIGS. 4 and 5 and the operation of this will be described in more detail below.

The operation of the adders in each stage is generally similar and will be described with reference to stage 1. Input data from the parallel path 15 is initially loaded into the 16 bit positions of lowest significance in the register 16 and the remaining positions in the shift register are all initially connected to the 16 bit position so as to contain the same digital signal as the most significant bit of the input data and thereby achieve sign extension of the value contained in the register 16. The apparatus can handle positive or negative numbers using two's complement numerical formats. The adders in each stage form a succession of partial products corresponding to the input data multiplied by each of the bits in turn in the coefficient for that stage. Each adder is provided with an input gate 30 for forming a single bit of a new partial product which is supplied to an input 17 of the adder. The adder has sum and carry outputs 27 and 28 respectively and further sum and carry inputs 18 and 19 for values generated from a previous partial product for accumulation with the present partial product. Under the control of the control unit 25 and clock 26, each of the gates 30 receives a signal on line 31 corresponding to the first bit of the coefficient and at the same time receives a bit from the register 16 corresponding to the bit position of the particular gate 30. The gate 30 then provides an input 17 to the corresponding adder 11 such that the set of inputs 17 from all 36 gates 30 represent a partial product corresponding to the first bit position of the coefficient. For the first cycle of operation there will be no previous accumulated total in the adder 11 and the adder provides a sum output 27 but in the case of the first partial product there will of course be no signal on the carry output line 28. The sum input 18 of each adder is connected to a sum selector 32 located in a sum line 33 so that the selector 32 can select as an input a sum value from a previous stage or a sum value which is derived from the sum output 27 of the same adder. Similarly the carry input 19 of each adder for bit locations 2 to 36 is connected to a carry selector 34 located in a carry line 35 so that the selector 34 can select as a carry input a value taken from the bit position of next lower significance in the same stage or from the bit position of next lower significance in a previous stage. The carry output 28 of each adder is connected to the carry line 35 and the sum output 27 is connected to the sum line 33. The adders of bit 1 position in each stage have carry inputs 19 connected to the stage coefficient units 20, 21, 22 and receive no carry in signal except for the last bit of a negative coefficient and this will be explained below.

Each of the selectors 32 and 34 is controlled by the control unit 25 so that for the first partial product formation the selectors 32 and 34 select sum and carry inputs 18 and 19 from the previous stage. For stage 1, the selectors 32 and 34 are connected to a ground line 40 to provide a zero sum and zero carry signal for the first cycle of operation. Once the first partial product has been formed the selectors 32 and 34 are switched so that during the accumulation of partial products any sum output 27 is fed back to the input 18 of the adder 11 and any carry output 28 is fed to the carry input 19 of the adder of next higher significance in that stage. After he first cycle in which the first partial product is formed and output by each adder, the contents of the shift register 16 are moved to the next position of higher significance and the second bit of the coefficient from the unit 20 is supplied to the gates 30. The gates 30 now receive respective bits from the same locations in register 16 as before, although the contents have been shifted, together with the second bit of the coefficient and provide a new partial product to each of the adders 11. This is added to the existing partial product accumulation which has been supplied to input 18 so that each adder 11 provides a new sum output 27 and possibly a carry output 28. This is repeated with the selectors 32 and 34 remaining in the first condition for a plurality of partial products corresponding to each bit of the coefficient in turn together with the input data in register 16 moved to a position of higher significance for each bit of the coefficient. When the last partial product corresponding to the last bit in the coefficient has been accumulated by the adders 11 the selectors 32 and 34 are changed to a second condition so that any sum and carry signals on lines 33 and 35 are fed forwards to form inputs to the corresponding adders 12 of the second stage. During accumulation of the partial products in stage 1, any carry signals fed from one bit position to the next may have been partially resolved within stage 1. However, switching by the selectors 32 and 34 after accumulation of the last partial product for the stage is effected regardless of complete resolution of any carry signals within stage 1 so that a combination of sum and unresolved carry signals may be fed forwards to the next stage. This is repeated for each stage in turn. For stages after the first, the selectors 32 and 34 are switched during the first cycle of operation to connect as a sum input 18 the sum output 27 from the adder of corresponding bit position in the previous stage and similarly the carry input 19 receives any carry signal from the adder of next lower bit significance in the previous stage. In this way, the first cycle of operation of each stage after the first involves forming a first partial product and adding this during the first cycle of operation to any sum and carry signals brought forwards from the previous stage. After the first cycle of operation, the selectors 32 and 34 are switched so that any sum and carry outputs are utilized in the same stage as previously described for stage 1.

It will be appreciated that by providing 36 bits in register 16 and 36 adders in each stage, this allows for the increase in the number of bits necessary to calculate the product of the first and second digital signals fed to each stage. For the use of 16 bit words for input data, up to 16 bit coefficients, and up to 32 stages it is not necessary to exceed 36 bit positions and consequently no carry signal is necessary from the adder in the most significant position of each stage. For this reason the most significant adder in each stage has a single output 27 representing the sum with no related carry signal. The final stage N is arranged so that the sum and carry outputs 27 and 28 are connected to appropriate bit locations of a 36 bit carry propagate adder 45. This is a high speed adder having both sum and carry inputs at thirty six bit locations of increasing significance. A grounded signal is supplied on line 40 to the carry. input of least significance so as to indicate no carry input at this position. The adder is arranged to propagate the carry signals fully throughout all bit positions of the adder so that an output 46 is provided in which the carry signals have been fully resolved.

Figure 3:
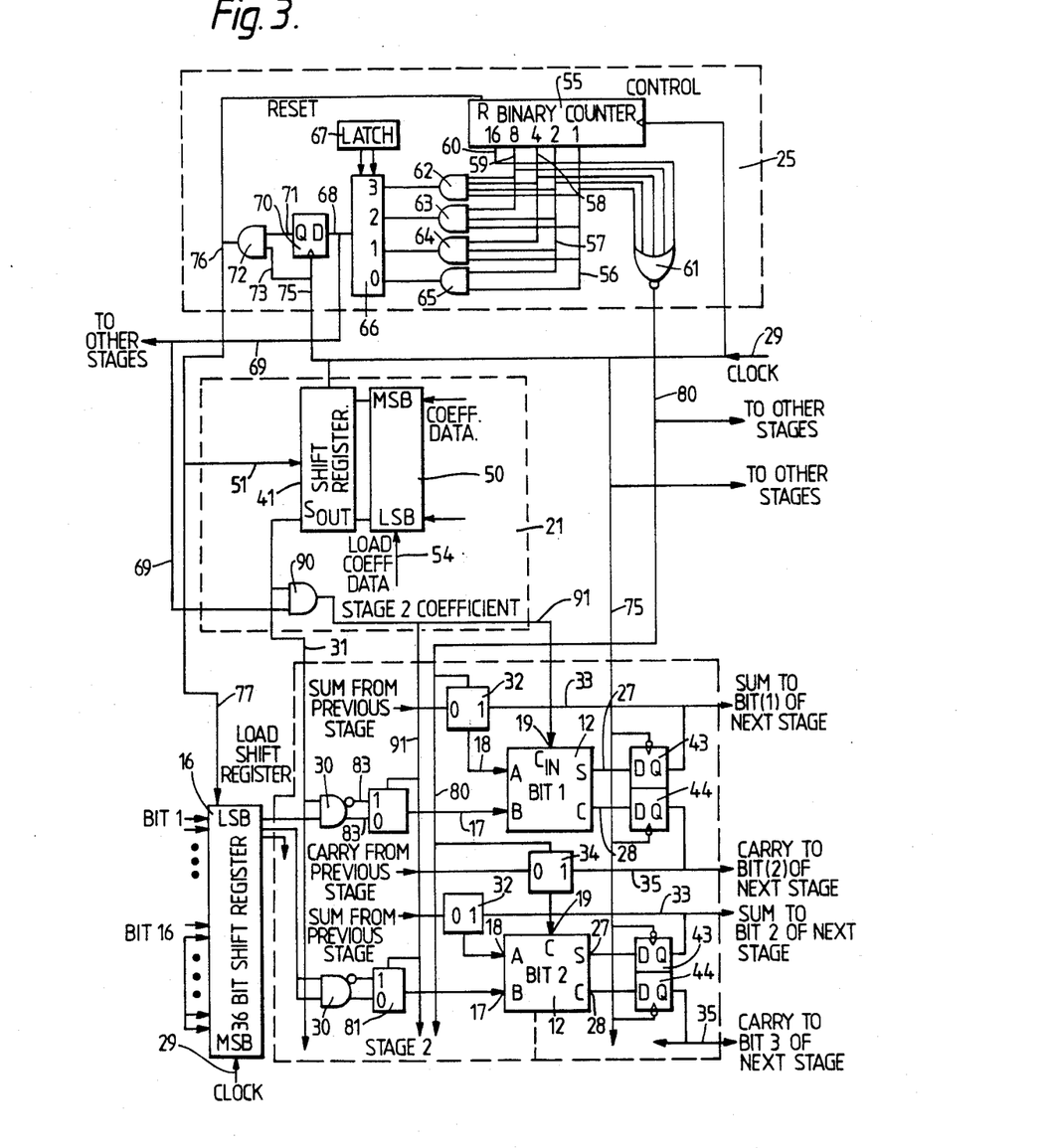
FIG. 3 shows more detail of the control and part of one stage of the embodiment shown in FIG. 1.
Figure 5:
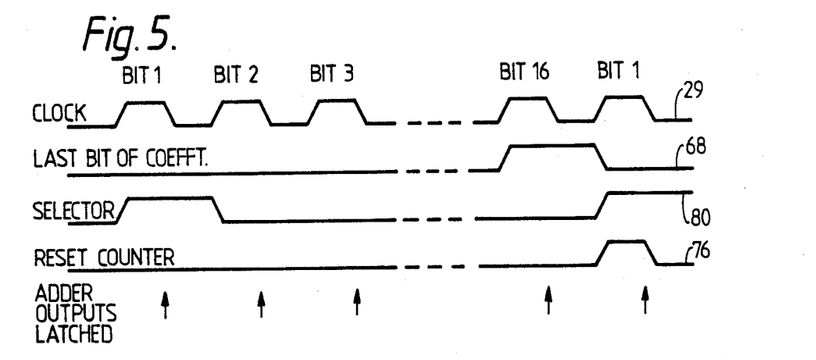
FIG. 5 illustrates similar timing control signals for the case where 16 bit coefficients are used.

The operation of each adder and the control mechanism will now be more fully described with reference to FIGS. 3 and 5. FIG. 3 shows the control unit 25, register 16, coefficient unit 21 and the two least significant bit positions of the second stage. The second stage is selected as being typical of any intermediate stage. Unit 21 includes a 16 bit shift register 41 which is loaded with all 16 bits in parallel from a 16 bit latch 50 under the control of a load control input signal 51 derived from the control unit 25. New coefficients may be loaded, for example from a microcomputer interface, into the latch 50 in an asynchronous manner independent of the timing of the control unit 25. A signal on line 51 is then used to transfer each bit of the coefficient from the latch 50 into the shift register 41. Loading of the latch 50 can be controlled by a control signal 54. In this example each stage of the apparatus is controlled by a common control unit 25 and is therefore treated as having a coefficient of uniform bit length. This may be 4 bits, 8 bits, 12 bits or 16 bits and the number of operations each involving a partial product formation and accumulation within a stage depends on the number of bits in the coefficients. The clock pulse signal such as that shown at 29 in FIG. 5 is fed from the clock 26 to a binary counter 55 having five output lines 56, 57, 58, 59 and 60 which are arranged to provide respective output signals when the count of clock pulses reaches 1, 2, 4, 8 or 16 respectively. Each of these lines is connected to a NOR gate 61. All four lines 56, 57, 58 and 59 provide four inputs to an AND gate 62. The three lines 56, 57 and 59 provide inputs to an AND gate 63. The three lines 56, 57 and 58 provide three inputs to an AND gate 64 and the two lines 56 and 57 provide two inputs to an AND gate 65. The outputs of the AND gates 62 to 65 form inputs 3, 2, 1 and 0 respectively of a selector 66 controlled by a latch 67 holding the bit length of the coefficients used. If the coefficient bit length is 4 bits then the selector 66 selects input 0. If the coefficient bit length is 8 bits the selector 66 selects input 1. If the coefficient bit length is 12 bits the selector 66 selects input 2. If the coefficient bit length is 16 bits then the selector 66 selects input 3. In this way, an output is provided on line 68 from the selector 66 when the binary counter 55 has reached a clock pulse count indicating that the last bit of the coefficient has been reached. This provides a last bit of coefficient signal on line 69 which is used for generating a plurality of control signals for use by each stage of the adding apparatus. The signal on line 68 is illustrated by the numeral 68 in FIG. 5. It is also fed as an input to a positive edge triggered D type flip-flop 70 which receives clock pulses on line 75. At each positive edge of a clock pulse the flip-flop 70 samples the signal level on line 68 and retains that signal level on its output 71 until the next sample is taken at the next positive edge of a clock pulse. The output 71 forms an input to a further AND gate 72 also arranged to receive a clock pulse input on line 73. In this way the AND gate 72 provides an output 76 of the form shown in FIG. 5 which does three things. It is fed back to the binary counter 55 in order to reset the binary counter ready for a new sequence of operations. It is also fed on line 77 for use in reloading the shift register 16 with new input data ready for the next product formation. It is also connected to line 51 to reload the coefficient register 41. The NOR gate 61 is arranged to provide a selector switching output on line 80 for controlling the selectors 32 and 34. As is shown in FIG. 3, each adder sum output 27 is connected through a D latch 43 to the sum line 33. The carry outputs 28 are similarly connected through a D latch 44 to the carry line 35. The D latches 43 and 44 are negative edge triggered D type flip-flops controlled by clock pulses supplied from line 75. The selectors 32 and 34 switch the sum and carry signals supplied to the sum and carry inputs in dependence on control signals supplied on line 80 from the NOR gate 61. The signal 80 is shown in FIG. 5 and as can be seen, the first clock pulse sets the signal 61 to cause the selectors to select inputs from a previous stage. Subsequent clock pulses reset the selector 61 until the next bit 1 clock pulse occurs. The gate device 30 consists of a gate having an AND output 82 and a NAND output 83 as well as a selector 81 arranged to select as the input 17 for the adder 12 either line 82 or 83 as will be described below in order to handle negative coefficients. The gate 30 has two inputs one connected to the corresponding bit location of the shift register 16 and the other input is derived from the particular bit of the coefficient which is output on line 31 from the shift register 20. It will be appreciated that one input of each of the thirty six gates 30 is connected to a corresponding one of the thirty six bit positions in the register 16 although only two are shown in FIG. 3 for simplicity.

This example is arranged to handle positive or negative numbers using two's complement numerical formats. In this format any positive number has a zero in the most significant position and the negative of that number is formed by inverting the bit pattern and adding 1 to the least significant bit. Similarly a negative number having a 1 in the most significant position can be converted into a positive number by inverting each bit and adding 1 to the least significant bit. In order to deal with negative coefficients it may be necessary to add a carry-in signal into the least significant bit adder of each stage and to effect inversion. This is achieved by the use of an AND gate 90 arranged to receive inputs from the output of the shift register 41 and the signal on line 69. A signal value 1 on the line 69 indicates when the last bit of the coefficient is being handled and if the coefficient bit is a 1 indicating a negative number at the same time as line 69 has the value 1, the AND gate 90 provides an output on line 91 which forms a carry-in input 19 into the least significant adder 11. This similarly applies to the least significant adder position of each stage of the adding apparatus if the coefficient is negative. If positive, the AND gate 90 cannot receive two simultaneous signals of value 1. An output from the AND gate 90 is also fed on line 91 to control selectors 81 so that the last bit of a negative coefficient causes each selector 81 in that stage to select the NAND output 83 at each bit location.

Figure 4:
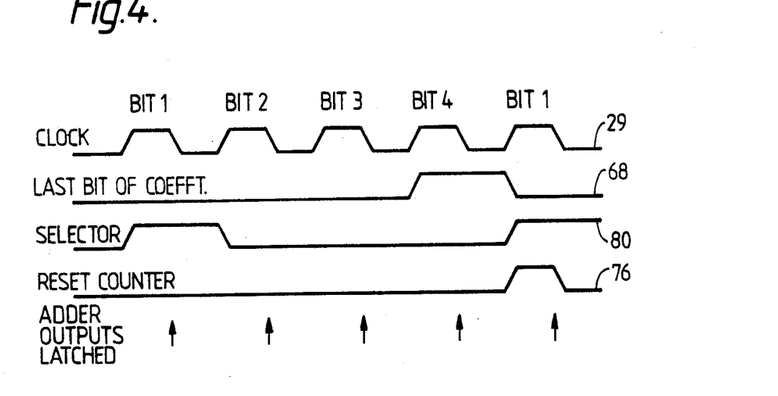
FIG. 4 illustrates various timing control signals used when 4 bit coefficients are used in the arrangement of FIG. 1.

An example of the operation of this apparatus will now be described in more detail. Initially consider the sequence of operations necessary for stage 1 to carry out the multiplication of input data representing the decimal number 5 by a coefficient representing the decimal number 4. The coefficient is represented by the binary number 0100 indicating the positive number 4. This is loaded into the shift register 41 and the latch 67 is set to indicate a coefficient bit length of 4 bits. The input data 5 can be represented by the binary number 00000101 allowing sufficient bit positions for the multiplication and the remainder of the shift register 16 will contain zeroes in the positions of higher significance. The first cycle of operation controlled by the first clock pulse will cause the least significant bit of the coefficient from the register 41 to be supplied on line 31 to each of the gates 30. The register 41 is arranged to output the least significant bit first and has been shown with the least significant bit location at the left hand side of the register adjacent the line 31. As the signal on output 68 and line 69 will not yet indicate that a last coefficient bit has been reached the gate 30a will operate as an AND gate thereby form a first partial product of the least significant bit of the coefficient with the data in the shift register 16. This will supply on each of the inputs 17 of the adders 11 a first partial product 00000000. The output of the adder 11 is latched by the latches 43 and 44 for one complete clock pulse and is selected by selectors 32 to be accumulated with the second partial product. The second partial product is generated by the next clock pulse 29 causing a further cycle of operation in which the second bit of the coefficient is fed onto line 31 from the register 41 and the contents of the shift register 16 are moved to one position of higher significance with the least significant position receiving a zero. Gates 30 still operate as AND gates and the second partial product 00000000 is generated and added to the adders 11. The output is again latched and fed back for accumulation with the next partial product. This is generated by the next clock cycle which causes the third bit of the coefficient to be fed onto line 31. As this bit is a 1, the third partial product generated by the gate 30 on the AND output 82 is 00010100. This is accumulated by each of the adders 11 and the output is again latched and fed back for accumulation. The next clock pulse causes the binary counter 55 and selector 66 to indicate on line 68 that the last bit of the coefficient has now been reached. This is fed as one input to the AND gate 90 but as the last bit of the coefficient is a zero, no signal is generated on line 91 as the coefficient represented a positive number. No carry input 19 is generated for the bit 2 location and the selectors 81 still select the AND outputs 82 of the gates 30. The fourth partial product formed by the gates 30 is again 00000000 as the last bit of the coefficient was zero. The timing diagram for this 4 bit coefficient is illustrated in FIG. 4. At the end of bit 4, the latches 43 and 44 hold the sum and carry outputs and at the beginning of the next clock pulse, the NOR gate 61 changes the signal on line 80 so that the selectors 32 and 34 cause the output of the first stage to be fed forward to appropriate bit locations of the next stage rather than recirculating them for further processing in the first stage. At that time the latched outputs in the first stage represent the accumulated total 00010100 which represents the positive decimal number 20.

In the case of a negative coefficient such as would arise in multiplying the positive input data decimal 5 by the negative decimal coefficient 4, the input data would be represented in binary form by 00000101 as before but the coefficient will this time be represented in binary form by 1100. The cycles of operation for each clock pulse will be repeated as previously described in that the first partial product will be generated as 00000000. To this will be added the second partial product which is 00000000. To the accumulated total will be added the third partial product 00010100. However, on coming to the last bit of the coefficient in the shift register 41 this is represented by the numeral 1 indicating a negative coefficient. In order to handle this it is as previously described necessary to invert the bit pattern and add 1 to the least significant bit. The signal on line 69 generated when the last bit of the coefficient is reached forms an input to the AND gate 90 which also now receives a 1 from the last bit of the coefficient in the register 41. This causes a signal to be generated on line 91 forming a carry input 19 for the least significant adder 11. The selectors 81 also receive the signal on line 91 causing selection of the NAND outputs on lines 83 thereby inverting the bits fed on each of the inputs 17 to the adders of that stage. Consequently the fourth partial product added to the accumulated total in the adders 11 is now represented by 11010111. This gives an accumulated total with the carry-in 1 on line 91 which is represented by the binary number 11101100. This represents the negative decimal number minus 20.

It will be appreciated that in the above examples, the simple multiplication of $+5 \times +4$ did not involve any carry signals. However the multiplication of $+5$ by $-4$ did involve carry signals in the addition of the fourth partial product as well as the final carry-in signal on line 91. These carry signals are connected to the next adder of higher significance through selectors 34 within the same stage of the adding apparatus. As the outputs of the adders 11 are latched they do not have to operate sufficiently fast to resolve any carry signals through all bit positions of a single stage prior to the selector signal on line 80 causing the selectors 32 and 34 to reroute the sum and carry signals forward to the next stage of the adding apparatus. This enables the adders to operate at a high speed controlled by the selector signal 80 illustrated in FIGS. 4 and 5. Each cycle of operation involving the generation and accumulation of a partial product is controlled by a clock pulse of signal 29 but under the control of the selector signal on line 80, the product formation operation of each stag is terminated after accumulation of the last partial product so that a combination of sum and carry signals is fed into the input of the next stage allowing each stage to begin a new product formation even if the carry signal has not been fully resolved from the previous product formation by that stage. It will also be appreciated that the sum and carry signals brought forward from one stage into the next form an initial input into all stages after the first stage so that during the first cycle of operation controlled by the first clock pulse of a ne product formation operation the brought forward sum and carry signals can be combined with any first partial product formed by a subsequent stage. This avoids unnecessary loss of time as the first partial product is otherwise added to a set of zero signals.

In the above example the output of the shift register 16 holding the input data is fed on respective bit lines to corresponding bit locations of each of the stages simultaneously so that the input data is fed in parallel to all stages. The register 16 relocates its contents for each clock pulse, the contents moving progressively to locations of higher significance with the vacated locations being filled with zeros. After the last stage of adders, the sum output 27 of each adder 13 is connected to the corresponding bit input of the adder 45 whereas the carry output 28 of each adder is connected to a carry input of next higher significance in adder 45. The least significant input bit position for the adder 45 always has a zero signal carry-in. The adder 45 is controlled by an input signal on line 93 which is arranged to receive the selector signal 80 from the control unit 25 so as to latch the input data received on the inputs to the adder 45 when the selector signal 80 illustrated in FIGS. 4 and 5 goes to 1 indicating that a new sequence of operations is about to begin for new product formation.

Once the inputs to the adder 45 have been latched, this high speed adder can resolve the carry signals throughout all 36 bit positions so that the output represents a fully resolved sum. Whilst this is occurring stages 1 to N may be involved in calculating and accumulating further products. In order to avoid delays in output it is necessary for the high speed adder 45 to resolve any previously unresolved carry signals within the number of clock pulses necessary for the previous stages to produce further accumulated product outputs. It is however possible to rely on only the one high speed adder 45 while the adders used in the previous stages do not need to propagate the carry and can therefore be relatively slow.

Figure 2:
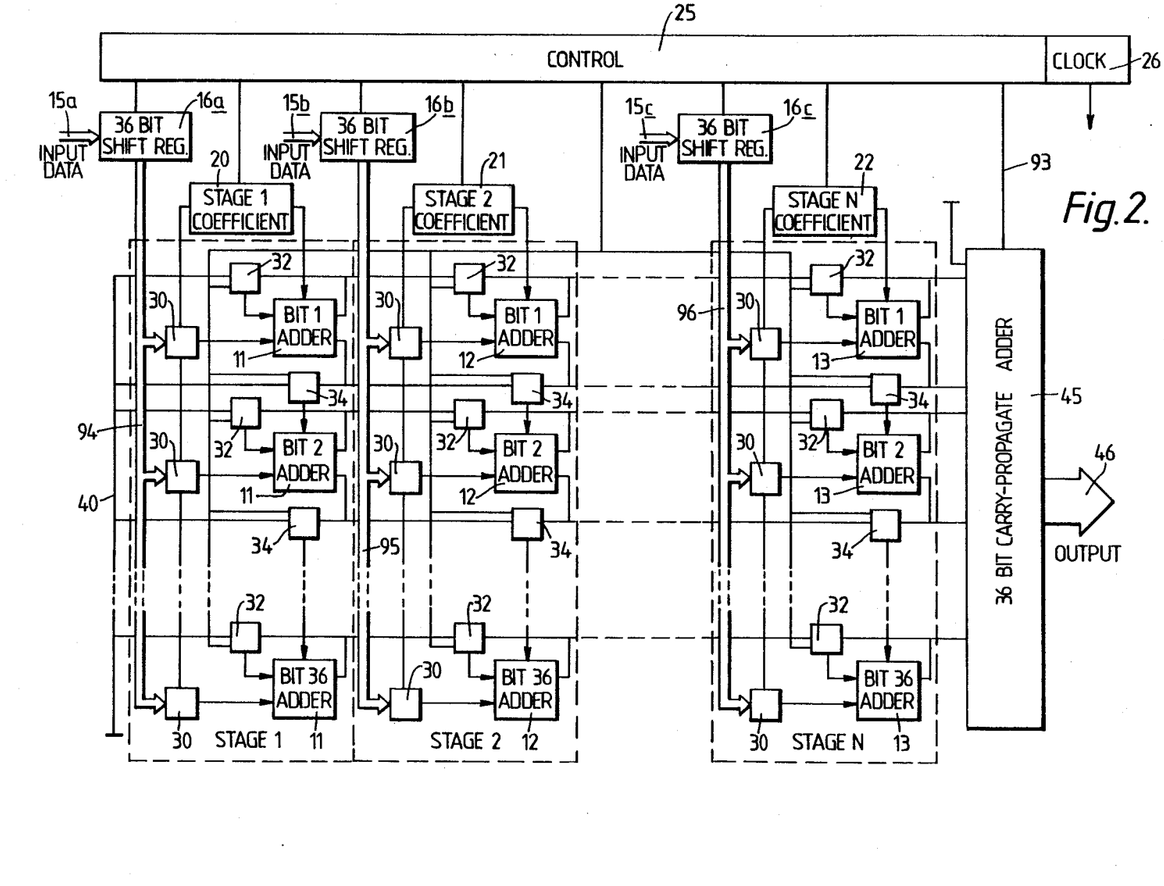
FIG. 2 is a block diagram showing a modification of the arrangement illustrated in FIG. 1.

In the example shown in FIG. 1 the same input data from one register 16 is supplied to each stage of the adding apparatus simultaneously. It is however possible in a modified arrangement to provide separate input data to each of the stages. Such an arrangement is schematically illustrated in FIG. 2 in which each stage has its own 36 bit register 16a, 16b, 16c etc each arranged to receive input data separately on 16 parallel bit lines 15a, 15b, 15c. Other parts have the same reference numerals as have been used in FIG. 1. The operation of this is generally as previously described although in this case the first digital signal forming input data for each of the stages will be derived from its own shift register rather than from a common shift register. Each shift register 16a, 16b and 16c is connected by its own parallel data path 94, 95, 96 to the respective gates 30.

Figure 6:
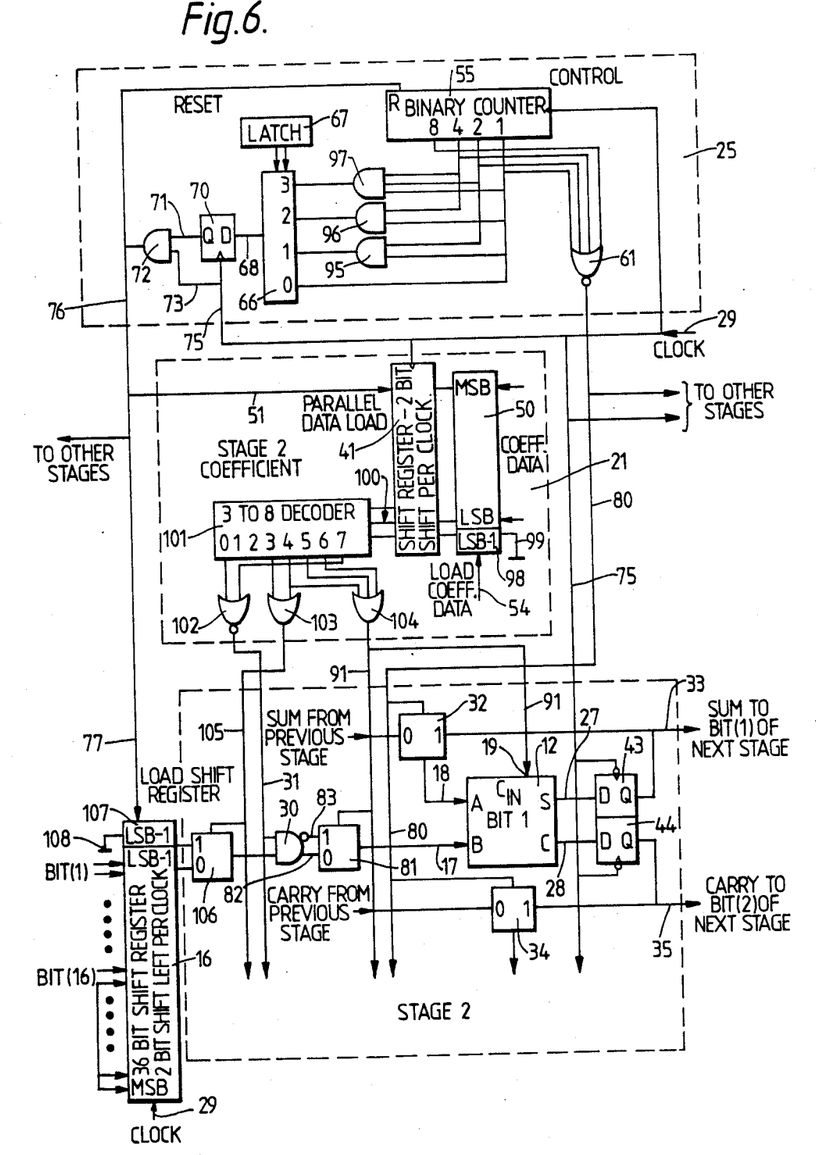
FIG. 6 illustrates a modification of the arrangement of FIG. 3 in which two bits of each coefficient are used simultaneously.

In the example described with reference to FIGS. 1 and 3, a minor cycle corresponding to one clock pulse is taken for each partial product formation and the number of partial products depends on the number of bits in the coefficient. Each coefficient bit is handled one at a time so that a major cycle necessary to form a product equals the minor cycle duration multiplied by the number of bits in each coefficient. The input data used for each product formation is updated for all stages after each major cycle. Improved speed of operation may be achieved by a modification illustrated in FIG. 6 in which each partial product is formed by considering three bits of the coefficient simultaneously and advancing the range of bits considered two bits at a time. In this way, the number of minor cycles necessary for each product formation is equal to half the number of bits in each coefficient. This enables the input data to be updated twice as often as the FIG. 3 arrangement. In order to use two coefficient bits simultaneously the modified arrangement of FIG. 6 uses second order Booth's encoding. According to Booth's encoding, a first binary coded digital signal may be multiplied by a second binary coded digital signal by the formation of a succession of partial products each using three bits of the second digital signal and advancing by two bits of the second digital signal for each partial product formation. The three bits of the second digital signal are decoded to give an octal value between 0 and 7 and depending on the octal value obtained, the partial product derived from the first digital signal is ascertained according to the following table:

| BITS OF SECOND DIGITAL SIGNAL (COEFFICIENT) | | | | VALUES TAKEN FROM |
| --- | --- | --- | --- | --- |
| MOST SIGNIFICANT BIT | | LEAST SIGNIFICANT BIT | OCTAL VALUE | FIRST DIGITAL SIGNAL (INPUT DATA) FOR PARTIAL PRODUCT |
| 0 | 0 | 0 | 0 | ALL ZERO |
| 0 | 0 | 1 | 1 | ACTUAL INPUT DATA VALUES |
| 0 | 1 | 0 | 2 | ACTUAL INPUT DATA VALUES |
| 0 | 1 | 1 | 3 | INPUT DATA VALUES AFTER SHIFTING TO NEXT POSITION OF HIGHER SIGNIFICANCE |
| 1 | 0 | 0 | 4 | TWO'S COMPLEMENT OF INPUT DATA AFTER SHIFTING TO NEXT POSITION OF HIGHER SIGNIFICANCE |
| 1 | 0 | 1 | 5 | TWO'S COMPLEMENT OF INPUT DATA |
| 1 | 1 | 0 | 6 | TWO'S COMPLEMENT OF INPUT DATA |
| 1 | 1 | 1 | 7 | ALL ZERO |

The above table has the effect that if the octal value is 0 or 7 then the input data is multiplied by zero. If the octal value is 1 or 2 the input data is multiplied by +1. If the octal value is 3 the input data is multiplied by +2. If the octal value is 4 the input data is multiplied by −2. If the octal value is 5 or 6 then the input data is multiplied by −1. The input data values which are used for forming partial products after decoding the coefficient bits are supplied to respective bit location adders arranged in a succession of stages as previously described with reference to FIGS. 1 and 3. The modified control unit 25, coefficient unit 21, register 16 and part of stage 2 is illustrated in FIG. 6. Parts which are similar to those of FIGS. 1 and 3 have been marked with similar reference numerals. Although part of stage 2 has been illustrated it will be understood that a similar arrangement is used for each stage except that the first stage does not receive any sum or carry from the previous stage and the last stage will supply sum and carry signals to the final adder 45 rather than to a subsequent stage. In the control unit 25 the arrangement is generally similar to that previously described but in this case only half as many clock pulses are necessary in order to complete any product formation. Consequently for a 16 bit coefficient the binary counter 55 only needs to count eight clock pulses and so the counter 55 has only four outputs corresponding respectively to decimal counts 1, 2, 4 or 8. All four outputs are supplied to the NOR gate 61 used to provide the selector signal 80 as previously described. The selector 66 is again controlled by the latch 67 in which the coefficient bit length is loaded. The output corresponding to number 1 from the binary counter 55 is directly to the 0 input 66. Outputs 1 and 2 from the binary counter 55 are connected to an AND gate 95 forming an input to input number 1 of the selector 66. Outputs 1 and 4 of the binary counter 55 are connected to an AND gate 96 forming an input to input number 2 of selector 66. Outputs 1, 2 and 4 of the binary counter 55 form inputs to an AND gate 97 forming an input to input number 3 of the selector 66. The selector 66 is connected to a latch 70 and AND gate 72 which operate in generally the same way as previously described with reference to FIG. 3.

The coefficient unit 21 is modified in that the shift register 41 and latch 50 have an additional location at a position of lower significance than the least significant bit of the coefficient itself. This is achieved by providing an additional location 98 at the least significant end of the latch 50 and connecting this to ground as indicated at 99. In this way, the shift register 41 is connected by three lines 100 to a decoder 101. The decoder 101 receives three bits simultaneously from the shift register 41 so that when considering the least significant two bits of the coefficient it also receives a zero at the least significant position which has been derived from the location 98. For each clock pulse, the contents of the shift register 41 are moved two positions down in significance so that the decoder 101 initially receives the least significant bits and for each clock pulse it receives an input corresponding to a shift to two places of higher significance. In other words, for the first partial product the decoder 101 receives zero at the least significant position together with the two least significant bits of the coefficient which will be considered as bits 1 and 2. For the second partial product the decoder 101 will receive bits 2, 3 and 4 of the coefficient. For the third partial product it will receive bits 4, 5 and 6 of the coefficient and so on. The decoder 101 converts the three input signals to form an octal output on one of lines 0 to 7. Outputs 0 and 7 are connected to a NOR gate 102. Outputs 1 and 2 have no connection. Output 3 is connected to an OR gate 103. Output 4 is connected to the OR gate 103 and also to a further OR gate 104. Output 5 is connected to the OR gate 104. Output 6 is also connected to the OR gate 104 and output 7 is connected to NOR gate 102. The OR gate 104 is arranged to provide an output on lines 91 as previously described with reference to FIG. 3. The signal on line 91 is used to form a carry input 19 to the first bit location of each adder and it is also used to control the selector 81 as previously described. The output from NOR gate 102 provides a signal on line 31 similar to that described in FIG. 3 and this forms one input to the AND gates 30. The OR gate 103 is used to provide a signal on line 105 for controlling a further selector 106 controlling the input supplied to the second input of AND gates 30. Each bit location in the stage has a selector 106 similar to that shown in FIG. 6 which is connected to two adjacent bit locations in the shift register 16. The shift register 16 is generally as previously described with reference to FIG. 3 although a further location 107 connected to ground at 108 is provided below the least significant bit location in the register 16. In this way the selector 106 for the bit 1 location is connected to location 107 and to bit 1 (being the bit of least significance) of the input data register 16. The selector 106 for the bit 2 location has been omitted for simplicity but this will be connected to bit locations 1 and 2 in the shift register 16. Similarly for bit 3 location the selector 106 will be connected to bit positions 2 and 3 in the shift register 16.

Operation of the arrangement in FIG. 6 can now be understood with reference to the above table showing the operation for different octal values. If the three bits fed from the shift register 41 to the decoder 101 correspond to octal values 0 or 7, the NOR gate 102 will output a zero on line 31 forming one of the inputs to the AND gate 30. At this time no output is derived from the OR gate 104 so that the selector 81 will be selecting the AND output 82 of the gate 30 so that zero will be fed to all the adders in that stage regardless of the contents of the shift register 16. If the octal value derived from the decoder 101 is either 1 or 2 then no output is provided to any of the gates 102, 103 or 104 so that the NOR gate 102 will provide a 1 on line 31 such that gate 30 will now provide an AND output 82 supplying to each of the adders in the stage the actual bit values of the input data held in the shift register 16. If the octal output from decoder 101 has the value 3 then a signal is supplied to the OR gate 103 which is supplied via line 105 to each of the selectors 106 which thereby supply to the AND gates 30 the contents of the shift register 16 as if they had been moved to one position of higher significance. An output 4 from the decoder 103 has a generally similar effect to that previously described for an output 3 except that a signal is also fed to the OR gate 104. This has the effect of forming the two's complement of the input data by providing signals on line 91 which operate the selectors 81 to invert the input data by selecting the NAND outputs 83 of each of the gates 30 and supplying a carry in signal to input 19 of the least significant adder in the stage. An octal output 5 from the decoder 101 has a similar effect to that just described for an output 4 except that in this case no signal is fed to the OR gate 103 so that the selectors 106 select the normal bit locations in the register 16 without causing any shift to a position of higher significance. An output 6 from the decoder 101 has exactly the same effect as output 5 just described.

It will therefore be seen that by using the arrangement of FIG. 6 which employs Booth encoding, the bits of each coefficient are taken three at a time to form each partial product so that half as many minor cycles or clock pulses are needed for each product formation and only half as many partial products are involved in each product formation. The input data used in the shift register 16 can therefore be updated twice as often as in the arrangement shown in FIG. 3.

In both the examples of FIGS. 1 and 2 each stage of the adding apparatus is connected in sequence to the next stage so that all products formed are fed in sequence through each stage of the adding apparatus before arriving at the final adder 45. It may however be arranged that the interconnection between the output of one stage and the input of subsequent stages may be selectively programmed to permit the output of any one stage to be connected to form the input of one or more selected subsequent stages. In this way the product formed by any one stage may be combined with the product of a programmable selection of other stages. It will also be appreciated that in the example of FIG. 1, the input data in the common input register 16 is updated at regular time intervals corresponding to the time interval needed for product formation by each of the stages. In that way, the accumulation performed by subsequent stage takes into account changes in the input data at regular equal time intervals. It is however possible to provide-selected interconnection between the stages so that the output of one stage is combined with the output of another stage not necessarily separated by the standard time interval from the input data used for the previous stage. It may be desirable to provide for time intervals having multiples or even variants of the time interval necessary for formation of a product by any one stage.

Figure 7:
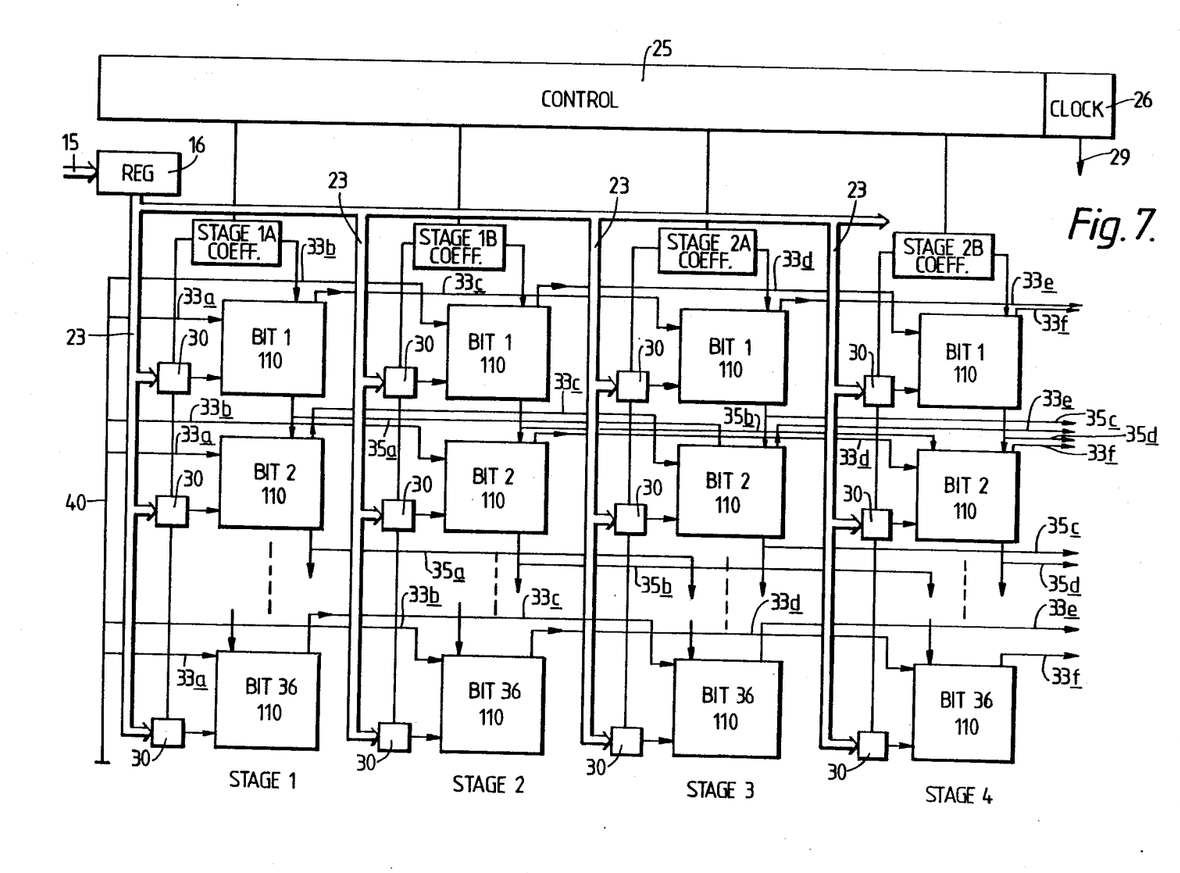
FIG. 7 illustrates a modification of the arrangement of FIG. 1 to provide a dual channel device.

One example of a modified arrangement in which the output of each stage is not passed in succession to the immediately adjacent stage is illustrated in FIG. 7. This shows a dual channel device in which stages 1, 3 and successive odd numbered stages form one channel. Stages 2, 4 and successive even numbered stages form a second channel. Similar reference numerals have been used for those parts corresponding to those shown in FIG. 1. For simplicity, the adders and associated selectors 32 and 34 have been shown as single units 110. In this arrangement the sum lines 33 have been split so that sections 33a, 33c and 33e interconnect stages 1, 3, 5 etc forming a first channel. Sections 33b, 33d and 33f of the sum line interconnect stages 2, 4, 6 etc forming a second channel. Similarly the carry lines have been split so that sections 35a and 35c interconnect stages 1, 3, 5 etc forming the first channel. Sections 35b and 35d of the carry line interconnect stages 2, 4 etc forming the second channel. In this way, two separate calculations may be carried out by the apparatus one calculation in channel 1 and a second calculation in channel 2. The final stage of each of the channels will be connected to a carry propagate adder similar to the adder 45 of FIG. 1 and a selector or multiplexor is interconnected between the final stage of each channel and the carry propagate adder so that the carry propaate adder alternately outputs the result of each of the two channels. In the examples shown in FIG. 7 all stages of both channels are supplied with the same input data from the shift register 16. It will however be understood that different input registers 16 may be used for each of the channels so that each channel has its own respective input data. It is also possible to provide separate shift registers 16 for each stage of each channel so that different stages use input data derived from different registers.

The above examples are particularly applicable to digital signal processing where a high sampling rate of input data is required. It will be appreciated that the input data used is updated after each product is formed by a single stage. The products which are therefore added together by any stage have been calculated using updated input data for the two products the time interval used in the updating being that necessary for formation of any one product. This speed of operation can be increased by using the Booth encoding arrangement of FIG. 6. It may also be varied by altering the bit length of the coefficients used. In the above examples the coefficient bit length can be selected depending on the application of the apparatus. For some purposes it may be preferable to use all 16 bits of each coefficient but in other cases it may be preferable to use fewer bits in the coefficients in order to increase the speed of operation. The speed of operation can therefore be simply changed by altering the coefficient bit length and the value stored in the latch 67 shown in the control unit 25.

The above examples have numerous practical applications. They may be used for high speed digital filters. The sampling frequency of the input signal may for example be up to 10 MHz. The programability of the filter coefficients allows adaptive processing to be implemented simply. For filters where the coefficients are not to vary with time a ROM can be used to store the coefficients. For time varying functions such as adaptive filters, a processor can be used to determine and load the appropriate coefficients. The apparatus may be used for convolution and correlation. These functions have applications in matched filtering, noise reduction and pulse compression in communication, radar and sonar systems. The apparatus may be used for matrix multiplication. The programability of the above described apparatus when used as a digital transveral filter allows the device to be used for flexible waveform generation and synthesis by changing the coefficients randomly, quickly and simply. They may be used for synthesisers including music synthesisers as the chip can generate accurate high band width signals. The apparatus may be used for Discrete Fourier Transforms. The apparatus also has applications in communication for adaptive equalisers and echo cancellers together with pulse generation and shaping, filtering and spread spectrum communication. Applications in radar, sonar and ultrasonic imaging including detection and pulse compression, beam forming and beam steering as well as Doppler processing and synthetic aperture radar. In speech processing the apparatus can be used for speech synthesis and the calculation of correlation and covariants matrices as well as pitch detection using correlation methods. The apparatus may also be used in various applications for fixed point matrix multiplication and pattern matching and recognition.

The invention is not limited to the details of the foregoing examples.

We claim:

1. Multistage digital signal multiplying and adding apparatus for effecting repeated addition to achieve multiplication and addition together of a plurality of results of said multiplication, said apparatus comprising a plurality of addition stages, each stage having:

a plurality of adding circuits at successive bit positions of different significance in a product to be formed by multiplication of a first digital signal for that stage with a second digital signal for that stage, each adding circuit being coupled (a) for forming partial products within each stage by successive operations using the first digital signal and a selected bit of the second digital signal, and (b) for adding successive partial products derived from use of bits of the second digital signal thereby forming the product after accumulation of a last partial product, each adding circuit providing after each partial product accumulation a first output indicating a sum for that bit position and a second output indicating any carry signal to be carried from that bit position to a bit position of greater significance, and selector circuitry interconnecting said adding circuits for selecting between (a) a first condition to supply signals from said first and second outputs of adding circuits within a stage to respective adding circuit within said stage for use in accumulation with further partial products and (b) a second condition to supply signals from the first and second outputs of adding circuits within a stage after accumulation of the last partial product as to input to adding circuitry external to said stage for forming an addition of the products of more than one stage, said selector circuitry being operative for any one addition stage to change to said second condition without resolving carry signals in said one addition stage through all bit positions within said one addition stage.

2. Multistage digital signal multiplying and adding apparatus for effecting repeated addition to achieve multiplication and addition together of a plurality of results of said multiplication, said apparatus comprising:

a plurality of addition stages, each stage having a plurality of parallel adding circuits at successive bit positions of different significance in a product to be formed by multiplication of a first digital signal for that stage and a second digital signal for that stage, the adding circuits being coupled to receive in parallel respective bits of the first digital signal (a) for forming partial products within each stage by successive operations using the first digital signal and a bit selection of one or more bits of the second digital signal, and (b) for adding successive partial products derived from use of bits of the second digital signal to an accumulation of any preceding partial products, thereby to generate the product after accumulation of a last partial product, each stage including control circuitry for controlling the operation of each adding device so that each product is formed by a succession of cycles, each cycle involving the accumulation of a partial product, and selector circuitry for connecting a parallel output from the adding circuits of one stage as a parallel input to the adding circuits of another stage after formation of a product by said one stage thereby to accumulate the products of more than one stage, said control circuitry being arranged to control said selector circuitry so that said parallel output from one stage is connected in parallel to said another stage during a first cycle of product formation by said another stage whereby the output of said one stage may be accumulated in said another stage with the first partial product of said another stage.

3. The apparatus according to claim 1 wherein said adding circuitry comprises adding circuits of a further stage whereby the adding circuits in each stage are used for the product formation by that stage and for the accumulation of products of more than one stage.

4. The apparatus according to claim 1 or claim 2 wherein means is provided for supplying a common first digital signal in parallel to each stage.

5. The apparatus according to claim 1 or claim 2 wherein said selector circuitry is coupled for selectably connecting the output of any one stage to one of a plurality of further stages.

6. The apparatus according to claim 1 or claim 2 including first connecting means interconnecting selection addition stage to form a first channel in which a plurality of products are formed and accumulated with each other to provide a first channel output and other connecting means interconnect selected other addition stages to form a second channel in which a plurality of other products are formed and accumulated with each other to provide a second channel output.

7. The apparatus according to claim 1 or claim 2 including timing means for generating a first time control signal for controlling each partial product formation and for generating a second time control signal for controlling intervals between connection of an output of one stage to an input of another stage, and means for updating said first digital signal for each stage at said intervals.

8. The apparatus according to claim 1 or claim 2, including circuitry for forming partial products by use of more than one bit of said second digital signal whereby the number of partial products formed for each stage product is less than the number of bits in said second digital signal.

9. The apparatus according to claim 1 or claim 2 in which said stages are interconnected between a first stage and a last stage, means being provided for receiving an output from the last stage and resolving any carry signals which have not been previously resolved.

10. A method of processing digital signals for forming a plurality of products of digital signals and adding a plurality of said products together, said method comprising the steps of:
supplying a multibit input digital signal to a plurality of multibit addition stages of a multistage adder,
supplying a second multibit digital signal to each stage for use in forming a product with the input digital signal for that stage,
forming a product in each stage by a succession of operations, each said operation generating a multibit partial product and accumulating the partial product with a sum of any preceding partial products for that stage,
the accumulation of the partial products within a stage comprising adding bits of corresponding significance and forming carry signals for carrying bits to positions of higher significance when necessary, and
after accumulation of the partial products for one stage, supplying an output from said one stage for use in addition to a product of another stage, said output from one stage being supplied before complete resolution of any carry signals within said one stage through all bit positions of said one stage.

11. A method of processing digital signals by forming a plurality of products of digital signals and adding a plurality of said products together, said method comprising the steps of:
supplying a multibit input digital signal in parallel to a plurality of multibit addition stages of a multistage adder,
supplying a second multibit digital signal to each stage for use in forming a product with the input digital signal for that stage,
forming a product in each stage by a succession of operation cycles, each cycle generating a multibit partial product and accumulating the partial product with a sum of any preceding partial products for that stage, and
after accumulation of the partial products for one stage, supplying a parallel output from said one stage for use in addition to a product of a coupled stage, said parallel output from one stage being supplied to an input of said coupled stage during a first operation cycle of said coupled stage whereby said parallel output from one stage may be accumulated in parallel in said coupled stage with the first partial product of said coupled stage.

12. A method of processing digital signals according to claim 10 or claim 11 wherein the output of each stage including sum and carry signals is supplied as an input to a further stage without complete resolution of the carry signals within any stage prior to supply to a subsequent stage in an interconnected chain, resolution of any unresolved carry signals being effected after accumulation by all the stages of the chain.

13. A method of processing digital signals according to claim 10 wherein the input digital signal is time varying, each stage product is formed using input data values at the beginning of a time interval allocated for the product formation by each stage, and at the end of each said time interval an output of each stage is advanced to a subsequent stage for accumulation at that subsequent stage and the input data is updated for use in the next product formation by each stage.

14. A method of processing digital signals according to claim 11 wherein the input digital signal is time varying, each stage product is formed using input data values at the beginning of a time interval allocated for the product formation by each stage, and at the end of each said time interval an output of each stage is advanced to a subsequent stage for accumulation at that subsequent stage and the input data is updated for use in the next product formation by each stage.

15. A method of processing digital signals according to claim 13 or claim 14 wherein the time interval between updating of input data used for a plurality of products to be added together is not constant for all the products.

16. A method of processing digital signals according to claim 10 or claim 11 wherein the time interval allocated for product formation by each stage is varied by bit length variation of the second digital signal used.

17. A method of processing digital signals according to claim 10 or claim 11, wherein the second digital signal is updated and is provided from an interface and stored asynchronously with transfer of one stage output to another, supply of a second digital signal from store to each stage being synchronized with transfer to one stage output to another.

* * * * *